May 6, 1969 J. C. SCHMITT 3,443,239

AM AMPLIFIER CIRCUIT

Filed June 30, 1966

INVENTOR.
JERRY C. SCHMITT

BY Moody & Gallagher

ATTORNEYS 3,443,239

AM AMPLIFIER CIRCUIT

Jerry C. Schmitt, Columbus, Ind., assignor to Collins Radio Company, Cedar Rapids, Iowa, a corporation of Iowa Filed June 30, 1966, Ser. No. 561,869
Int. Cl. H03g 3/30
U.S. Cl. 330—25 6 Claims

ABSTRACT OF THE DISCLOSURE

An AM transistorized amplifier circuit in which counter modulation is reduced by means of a low-pass filter feedback between emitter biasing means and the transistor base and by use of a modulated power supply. Advantageously, a plurality of transistors may be connected in parallel with improved transistor balance.

This invention relates generally to transistor circuits and particularly to a system for improving the amplitude modulation characteristics of an amplifier and also a system for maintaining balance between transistors connected in parallel.

There is a continuing need in the art for means for maintaining the output of a transistorized circuit proportional to a modulated input signal. This is particularly true in an AM transistorized amplifier. The output of an amplifier by definition is proportional to an input signal. However if the gain of the amplifier is not controlled the output characteristics will vary substantially as the input varies. This is particularly true in nonlinear AM amplifiers. Another difficulty with existing transistorized circuits is the frequent failure of the transistors when the input to the transistor is suddenly lost. This failure is particularly true of AM amplifiers and will be explained hereinafter.

It is therefore an object of the invention to provide improved AM modulation characteristics in transistorized power amplifiers with a minimum of complexity.

It is another object to provide a circuit which aids an AM amplifier in performing in the desired manner.

It is another object to insure transistor balance when a number of transistors are connected in parallel.

It is another object to provide a system which prevents the failure of a transistor when the input to the transistor is lost.

Further objects, features, and advantages of the invention will become apparent from the following description and claims when read in view of the accompanying drawings wherein like numbers indicate like parts and in which:

Figure 1:
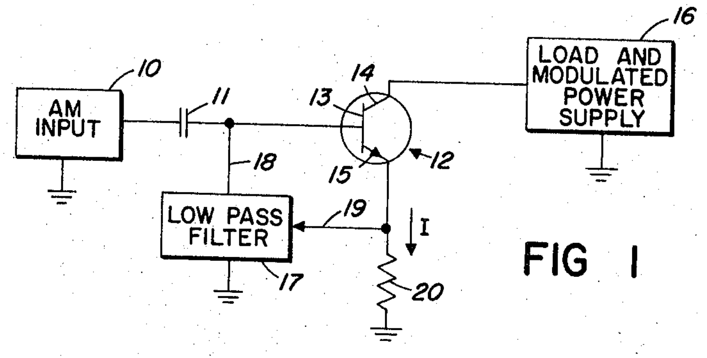
FIGURE 1 shows the simplest embodiment of the invention wherein the transistor is connected as a nonlinear amplifier.

FIGURE 1 shows a transistor 12 receiving an AM input 10 through a capacitor 11. The output of the transistor 12 is taken from the collector 14 and fed to a load and modulated power supply 16. Emitter 15 of transistor 12 is connected to ground through an emitter resistor 20. Any voltage appearing on emitter resistor 20 is fed back to base 13 through low pass filter 17.

Figure 2:
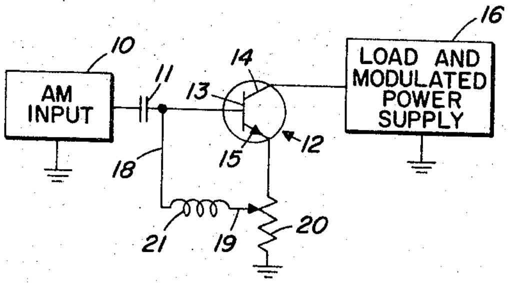
FIGURE 2 shows an embodiment which is quite similar to that of FIGURE 1 but wherein the low pass filter is shown in more specific detail.

The embodiment shown in FIGURE 2 is identical to that of FIGURE 1. However the low pass filter is shown to be an inductor 21. Also the variable tap 19 enables any portion of the voltage appearing across emitter resistor 20 to be fed back to the base of transistor 12 through inductor 21.

Figure 3:
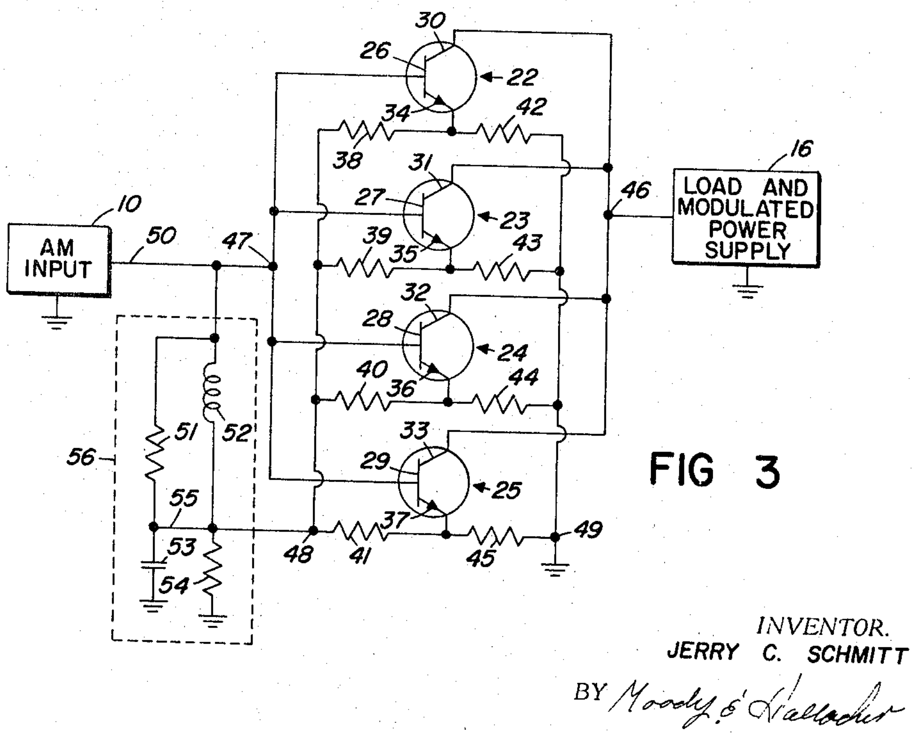
FIGURE 3 shows an embodiment in which a plurality of transistors are connected in parallel.

FIGURE 3 shows a plurality of identical transistors 26 through 29 connected in parallel. The bases of transistors 26 through 29 are connected to a common junction 47 by which they receive an RF input from AM input 10. Collectors 30 through 33 are connected to junction 46 through which they feed, load and modulated power supply 16. Emitters 34 through 37 of the transistors are connected through identical emitter resistors 42 through 45 to ground through common junction 49. Emitters 34 through 37 are also connected through similar resistors 38 through 41 to common junction 48 through which they are connected to low-pass filter 56 to junction 47. Low pass filter 56 is composed of a parallel combination of resistor 51 and inductor 52 in series with the parallel combination of capacitor 53 and resistor 54, and emitter resistors 38 to 41.

The operation of the embodiment shown in FIGURE 1 is as follows: When an AM input from AM input 10 is applied, a current I is made to flow in the emitter resistor 20. The voltage produced across emitter resistor 20 contains a certain DC component. This DC component is applied in full or in part through the low-pass filter 17 to the base 13 of transistor 12. This DC feedback voltage is forward biased, but since the DC component of voltage across the emitter resistor 20 is always less than the transistor base to ground voltage required to turn the transistor on, an input to transistor 12 is always required to produce emitter current.

As is well known in the art a transistor is a current gain device. Therefore both drive modulation and collector modulation must be applied for good modulation of the transistor. In effect, the RF drive modulation provides collector RF current modulation while the collector voltage modulation allows the modulated RF collector current to produce an AM envelope on the RF output. The collector modulation is provided by modulated power supply 16.

However, in most circuits the drive modulation produces some counter modulation on the base to emitter junction through some resistance in the DC path between the base and emitter. This resistance may be the transistor base to emitter resistance inherent in the transistor. Often this counter modulation is counteracted by adding a small amount of the modulation voltage into the base to emitter DC circuitry. This method is prone to transistor failure because the modulation voltage added in the base to emitter circuit will turn the transistors on even when RF drive is lost.

In the embodiment of FIGURE 1 the counter modulation is compensated by the voltage feedback from the emitter resistor 20 through the low-pass filter 17. Thus an increase in the RF drive voltage produces a proportional increase in collector current and results in good modulation. The circuit acts to protect the transistor 12 when the input is lost because the base bias modulation feedback from the emitter resistor 20 requires an input to transistor 12 for its production. The feedback voltage is therefore lost immediately upon loss of the input signal.

The low-pass filter 17 may be constructed as shown in the circuits of FIGURE 2 where inductor 21 and capacitor 11 in conjunction with the transistor input impedance act as a low-pass filter. The value of capacitor 11 is chosen such that $1/2\pi fc$ is small at the operating frequency $f$.

The variable tap 19 is used so that only a portion of the emitter resistor 20 DC voltage component may be used for feedback to base 13 of transistor 12. The value of inductor 21 is chosen such that the inductive reactance $2\pi fL$ is high at the operating frequency $f$.

In the embodiment shown in FIGURE 3 the transistors 26 through 29 are connected in parallel. The separate emitter resistors 42 through 45 act to balance the emitter currents and therefore the collector currents are also balanced and provide good transistor balance.

Resistors 38 through 41, capacitor 53, resistors 51 and 54 and choke 52 comprise the feedback low-pass filter. Resistors 42 to 45 have an ohmic value in relationship to the ohmic value of resistors 38 to 41 such that they have only a slight effect on the gain of the amplifier network. They therefore are not bypassed in order to improve stability and to achieve lower manufacturing costs. However, if the low-pass filter 56 is designed to have a capacitor input the emitter to ground resistors 42 through 45 must necessarily be bypassed.

The circuit shown in FIGURE 3 is also useful in power amplifiers which are not amplitude-modulated if it is desired to keep the conduction angle large as the RF input varies with the use of an external low impedance bias supply. For example, the circuit shown will give RF negative feedback having a controlling effect on the transistor DC bias depending upon the ratio of the DC voltage input to the DC output of the low pass filter.

Although this invention has been described with respect to particular embodiments thereof, it is not to be so limited, as changes and modifications may be made therein which are within the spirit and scope of the invention.

I claim:

1. An amplifier circuit comprising a transistor having first, second, and third electrodes; input means connected to said first electrode; output means connected to said second electrode; biasing means connected to said third electrode; low-pass filter means; passive electrical means connecting said low-pass filter means to said biasing means; and passive electrical means connecting said filter means to said first electrode whereby said low-pass filter means provides a feedback path between said biasing means and said first electrode.

2. An amplifier circuit as defined by claim 1 and further including a modulated power supply connected to said second electrode.

3. The circuit of claim 1 wherein said first, second and third electrodes are respectively the base, collector and emitter of said transistor.

4. The circuit of claim 1 wherein said low-pass filter means is an inductor having a high reactance at the operating frequency of said amplifier circuit, and wherein said passive electrical means between said low-pass filter means and said biasing means is adjustably connected to said biasing means so that any portion of the voltage of said biasing means can be applied to said low-pass filter means.

5. The circuit of claim 1 including a plurality of transistors in parallel with said transistor, all of said transistors being substantially similar.

6. The circuit of claim 5 wherein said biasing means consists of a plurality of similar resistors each in circuit with one of said transistors.

References Cited

UNITED STATES PATENTS

| | | | |
|---|---|---|---|
| 2,866,892 | 12/1958 | Barton | 329—101 X |
| 2,877,423 | 3/1959 | Webster. | |
| 3,304,508 | 2/1967 | Danielsen et al. | 307—235 |

FOREIGN PATENTS

| | | |
|---|---|---|
| 957,348 | 5/1964 | Great Britain. |

ALFRED L. BRODY, *Primary Examiner.*

U.S. Cl. X.R.

307—235; 325—181, 319; 329—168, 192; 330—29, 30; 332—59, 37, 31